(12) United States Patent
Nakahara et al.

(10) Patent No.: US 9,257,363 B2
(45) Date of Patent: Feb. 9, 2016

(54) SEMICONDUCTOR DEVICE AND METHOD OF MANUFACTURING THE SAME

(71) Applicant: Mitsubishi Electric Corporation, Tokyo (JP)

(72) Inventors: Kenta Nakahara, Tokyo (JP); Hiroshi Yoshida, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/572,655

(22) Filed: Dec. 16, 2014

(65) Prior Publication Data
US 2015/0255367 A1 Sep. 10, 2015

(30) Foreign Application Priority Data
Mar. 10, 2014 (JP) ................. 2014-045924

(51) Int. Cl.
| H01L 21/00 | (2006.01) |
|---|---|
| H01L 29/06 | (2006.01) |
| H01L 23/427 | (2006.01) |
| H01L 35/30 | (2006.01) |
| H01L 33/64 | (2010.01) |
| H01L 23/367 | (2006.01) |
| H01L 23/373 | (2006.01) |
| H01L 23/40 | (2006.01) |

(52) U.S. Cl.
CPC ........ *H01L 23/4275* (2013.01); *H01L 23/3675* (2013.01); *H01L 23/3735* (2013.01); *H01L 23/4006* (2013.01); *H01L 33/641* (2013.01); *H01L 35/30* (2013.01); *H01L 2924/13055* (2013.01)

(58) Field of Classification Search
CPC .......................... H01L 23/4275; H01L 35/30
USPC ........... 438/122; 257/625, 675, 706, 720, 796
See application file for complete search history.

(56) References Cited

U.S. PATENT DOCUMENTS

| 8,865,547 B2 * | 10/2014 | Kang ................ H01L 27/10876 438/259 |
| 8,916,447 B2 * | 12/2014 | Park .................... H01L 27/0207 438/381 |

FOREIGN PATENT DOCUMENTS

| JP | H07-176659 | A | 7/1995 |
| JP | 2000-058727 | A | 2/2000 |
| JP | 2006-134989 | A | 5/2006 |
| JP | 2006134989 | * | 5/2006 ............. H01L 23/40 |

* cited by examiner

*Primary Examiner* — Calvin Lee
(74) *Attorney, Agent, or Firm* — Studebaker & Brackett PC

(57) ABSTRACT

A base plate has a mounting surface on which a semiconductor element is mounted and a heat-radiation surface for radiating heat to a cooler. The cover has a portion that seals the semiconductor element on the mounting surface of the base plate. The cover has a projecting portion arranged outside the heat-radiation surface and projecting from a level of the heat-radiation surface in a thickness direction. The intermediate layer is arranged on the heat-radiation surface of the base plate, projects from the level of the projecting portion of the cover in a thickness direction, and is made of a thermoplastic material in a solid-phase state.

12 Claims, 12 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same and, in particular, to a semiconductor device having a heat-radiation surface for radiating heat to a cooler and a method of manufacturing the same.

2. Description of the Background Art

Since a power module easily generates a large amount of heat, the power module is mounted on a cooler such as a cooling fin or a heat sink. Since efficient heat radiation cannot be achieved due to the presence of a gap between the power module and the cooler, in general, heat-conductive grease is applied between a metal base plate which the power module has and the cooler. In terms of an applying operation, grease having relatively high fluidity is generally used. As a material of the heat conductive grease, a material having relatively high heat conductivity can be selected. However, since the heat conductivity is lower than those of the materials of the base plate and the cooling fin, the grease is desired to properly bury the gap between the base plate and the cooling fin without an excessive amount. For this purpose, a technique for controlling a thickness distribution of the grease has been examined.

For example, according to Japanese Patent Application Laid-Open No. 2000-58727, a technique for suppressing the thickness of grease to a low level at the center of the module has been examined. In this technique, projections are arranged on a peripheral side of mounting holes of a metal base. With this configuration, a moment is generated on the module by using a fastening force of a mounting screw, and the center of the metal base is brought close to the heat sink. As a result, the thickness of grease at the center is reduced.

According to the technique described in the publication, when a metal base (base plate) is mounted on a heat sink (cooler), the posture of the base plate with reference to the cooler is regulated by projections arranged on the peripheral side of the base plate. For this reason, the posture of a central portion possessing a large part of the base plate is only indirectly controlled through a moment of a module, and is not directly regulated. As a result, deviated stress easily occurs when the base plate is attached to the cooler. Due to the deviated stress described above, a thickness distribution of grease may be disturbed. Even though the thickness distribution of grease is proper immediately after the attaching operation, through a thermal cycle occurring with an operation of the power module, the thickness distribution of grease may be easily disturbed due to deviated stress. As described above, in the conventional technique, thermal and mechanical contacts between the base plate and the cooler may be easily insufficient.

SUMMARY OF THE INVENTION

The present invention has been made to solve the above problem and has, as its object, to provide a semiconductor device that can achieve preferable thermal and mechanical contacts with a cooler.

The semiconductor device according to the present invention has a heat-radiation surface for radiating heat to a cooler and includes a semiconductor element, a base plate, a cover, and an intermediate layer. The base plate has a mounting surface on which the semiconductor element is mounted and the heat-radiation surface opposed to the mounting surface, and includes a thickness direction from the mounting surface to the heat-radiation surface. The cover has a portion that seals the semiconductor element on the mounting surface of the base plate. The cover has a projecting portion arranged outside the heat-radiation surface and projecting from the level of the heat-radiation surface in the thickness direction. The intermediate layer is arranged on the heat-radiation surface of the base plate, projects from the level of the projecting portion of the cover in the thickness direction, and is made of a thermoplastic material in a solid-phase state.

According to the present invention, when the base plate is attached to the cooler, a posture of the base plate with reference to the cooler is regulated by the solid-phase intermediate layer arranged on the base plate. In this manner, deviated stress occurring when the base plate is attached can be suppressed. Thus, the thickness distribution of the intermediate layer having a phase changed into a liquid-phase state with heat after the base plate is attached is suppressed from being disturbed due to the deviated stress. When the phase of the intermediate layer is changed into a liquid-phase state, the projecting portion of the cover is supported by the cooler to keep a space that is necessary for the liquid-phase intermediate layer to be stably present between the base plate and the cooler. Thus, preferable thermal and mechanical contacts between the base plate and the cooler can be achieved.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
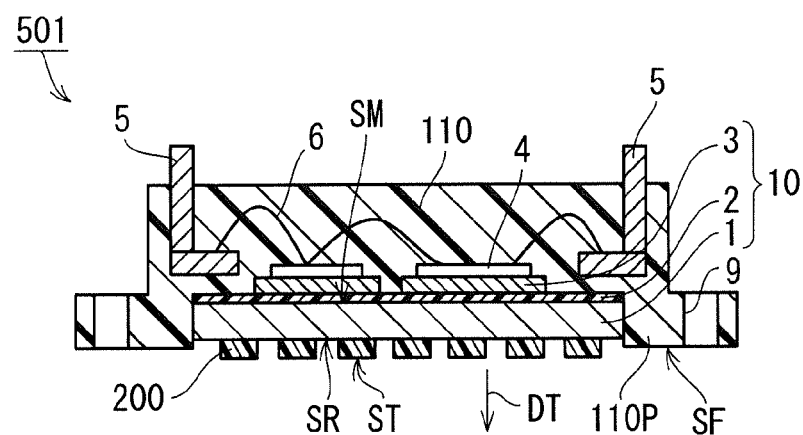
FIG. 1 is a diagram schematically showing the configuration of a device according to a first preferred embodiment of the present invention, and is a sectional view along a line I-I in FIG. 2.

Preferred embodiments of the present invention will be described below with reference to the accompanying drawings. The same reference numerals in the following drawings denote the same parts or corresponding parts, and descriptions thereof will not be repeated.

First Preferred Embodiment

Figure 2:
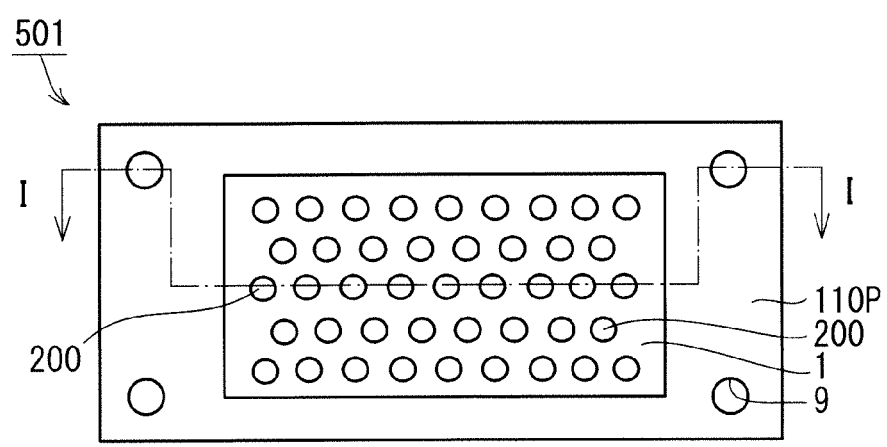
FIG. 2 is a schematic bottom view.

With reference to FIG. 1 and FIG. 2, a power module 501 (semiconductor device) according to the preferred embodiment has a heat-radiation surface SR for radiating heat to a cooler such as a cooling fin or a heat sink. The power module 501 has a semiconductor element 4, a circuit board 10, an external electrode 5, a wire 6, a cover 110, and an intermediate layer 200. The semiconductor element 4 is a power semiconductor element that is, for example, an IGBT (Insulated Gate Bipolar Transistor), a MISFET (Metal Insulator Semiconductor Field Effect Transistor), a JFET (Junction Field Effect Transistor), or a diode. The power module 501 is, for example, a device used in motor control for industrial apparatuses, consumer apparatuses, or the like.

The circuit board 10 has a base plate 1, an insulating layer 2, and a circuit pattern 3. The base plate 1 has a mounting surface SM (upper surface in FIG. 1) and a heat-radiation surface SR (lower surface in FIG. 1) that are opposed to each other. On the mounting surface SM, the semiconductor element 4 is mounted through the insulating layer 2 and the circuit pattern 3. The base plate 1 has a thickness direction DT (downward direction in FIG. 1) from the mounting surface SM to the heat-radiation surface SR.

The cover 110 has a portion that seals the semiconductor element 4 on the mounting surface SM of the base plate 1. The cover 110 has a projecting bottom portion 110P (projecting portion) arranged outside the heat-radiation surface SR and projecting from the level of the heat-radiation surface SR in the thickness direction DT. With the configuration, the projecting bottom portion 110P has an attaching surface SF projecting from the level of the heat-radiation surface SR in the thickness direction DT. In this manner, a step rising from the heat-radiation surface SR of the base plate 1 to the attaching surface SF of the cover 110 is formed. The projecting bottom portion 110P, as shown in FIG. 2, preferably completely surrounds the intermediate layer 200 on the base plate 1. The cover 110 is made of, for example, a resin.

An attaching hole 9 serving as a through hole for attaching a cooler (not shown in FIG. 1 and FIG. 2) is formed in the cover 110. The attaching hole 9 is arranged outside the heat-radiation surface SR and extends along the thickness direction DT. In the preferred embodiment, the attaching hole 9 penetrates through the projecting bottom portion 110P. In other words, the attaching hole 9 is formed in the attaching surface SF. The attaching holes 9, in FIG. 2, are formed at the four corners of the cover portion 110, i.e., the four corners of the projecting bottom portion 110P, respectively. The attaching hole 9 is formed to be separated from the base plate 1.

The intermediate layer 200 is arranged on the heat-radiation surface SR of the base plate 1, and projects from the level of the projecting bottom portion 110P of the cover 110 in the thickness direction DT. With the configuration, the intermediate layer 200 has a projecting surface ST projecting from the level of the attaching surface SF in the thickness direction DT. With the configuration, the intermediate layer 200 buries the step between the heat-radiation surface SR and the attaching surface SF on a part of the heat-radiation surface SR, and projects from the level of the attaching surface SF.

The intermediate layer 200 is made of a thermoplastic material the phase of which can be changed from a solid phase to a liquid phase with heat, and is made of, for example, a crystalline resin. The intermediate layer 200 has a solid-phase state at a point of time shown in FIGS. 1 and 2, i.e., at a point of time before the cooler is attached. The melting point of the material is preferably higher than an ordinary temperature and lower than the operating temperature of the semiconductor element 4. For this reason, when, as the semiconductor element 4, a semiconductor element with high operating temperature, in particular, a silicon carbide semiconductor element with a silicon carbide substrate is used, a range for selecting melting points can be widened. A solid filler that is always in a solid-phase state may be added to the thermoplastic material. The solid filler is made of a metal, for example.

The intermediate layer 200 is preferably only partially formed on the heat-radiation surface SR. More preferably, the intermediate layer 200, as shown in FIG. 2, has a plurality of patterns separated from each other on the heat-radiation surface SR. The shape of each of the patterns is, for example, a circular shape as illustrated or a hexagonal shape. Still more preferably, the patterns are arranged in a predetermined cycle on the heat-radiation surface SR.

The external electrode 5 is partially exposed to the outside of the cover 110 and electrically connected to the semiconductor element 4 in the cover 110. The external electrode 5 may project from the inside of the cover 110 to the outside of the cover 110.

The wire 6 is typically a bonding wire. The wire 6, in the cover 110, configures an electric path for the power module 501 together with the circuit pattern 3.

A method of attaching the power module 501 to a cooler will be described below.

Figure 3:
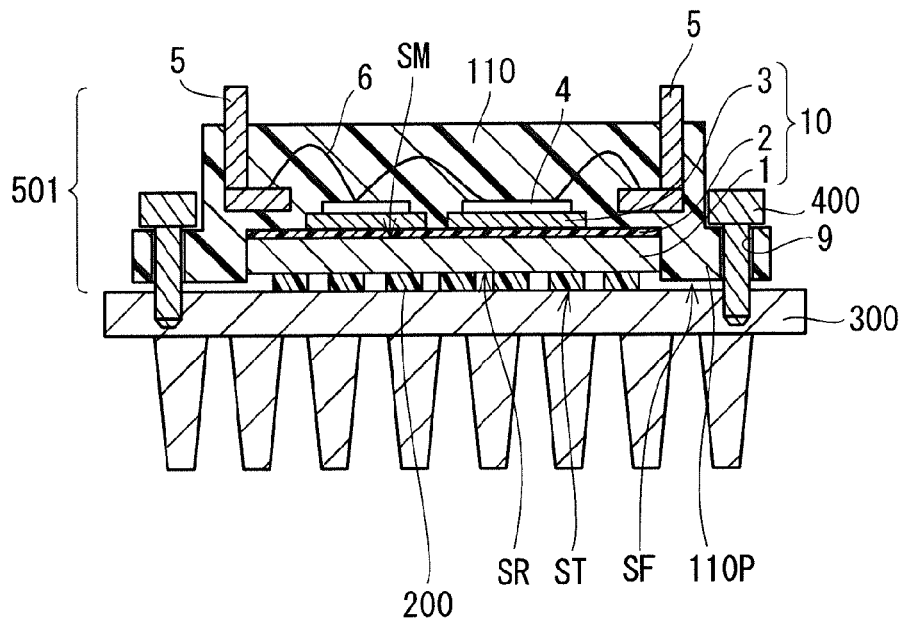
FIG. 3 is a sectional view schematically showing one step in a method of attaching the semiconductor device in FIG. 1 to a cooler.

Referring to FIG. 3, the power module 501 is placed on a cooling fin 300 (cooler) to cause the attaching surface SF to face the cooling fin 300. In this manner, the projecting surface ST of the intermediate layer 200 is supported by the cooling fin 300.

The cover 110 is attached to the cooling fin 300 with a screw 400 by using the attaching hole 9. In this manner, the power module 501 is attached to the cooling fin 300. The screw 400 is preferably fastened at a regulated torque.

The intermediate layer 200 is heated to change the state of the thermoplastic material configuring the intermediate layer 200 into a liquid-phase state. This heating can be executed by using heat generation caused by the operation of the semiconductor element 4.

Figure 4:
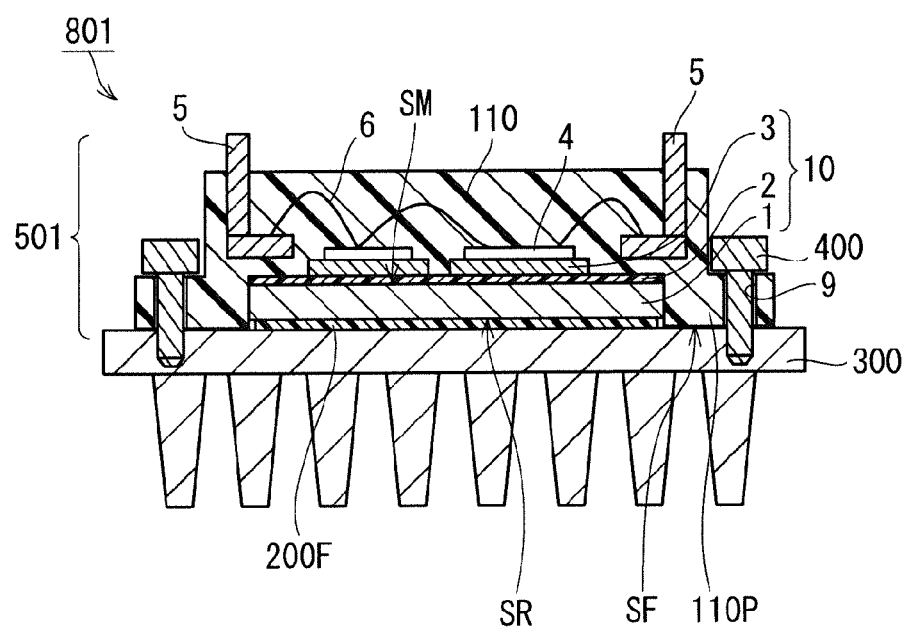
FIG. 4 is a diagram schematically showing the configuration of a cooler-equipped semiconductor device including the semiconductor device in FIG. 1 and the cooler.
Figure 5:
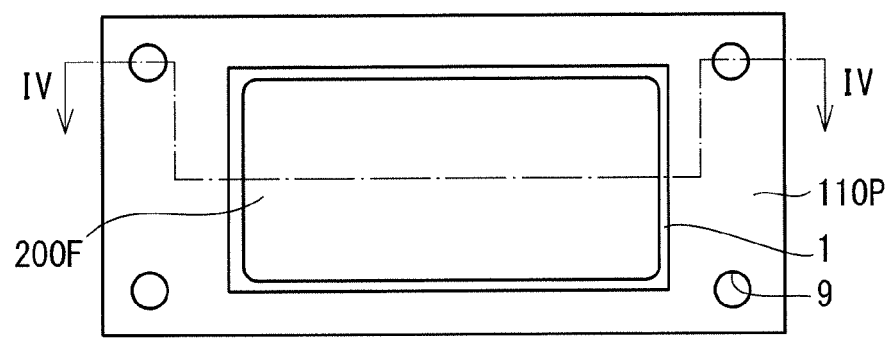
FIG. 5 is a schematic bottom view of FIG. 4.

With reference to FIG. 4 and FIG. 5, the intermediate layer 200 (FIG. 3) that is in a solid-phase state is changed into an intermediate layer 200F in a liquid-phase state as described above. The intermediate layer 200F wetly spreads on the heat-radiation surface SR, and, preferably wetly spreads on the entire area of the heat-radiation surface SR. In this manner, a cooling-fin-equipped power module 801 (cooler-equipped semiconductor device) is obtained. When the operation of the cooling-fin-equipped power module 801 is stopped, the state of the intermediate layer 200F is changed into a solid-phase state while the shape of the intermediate layer 200F is kept.

A comparative example will be described below.

Figure 6:
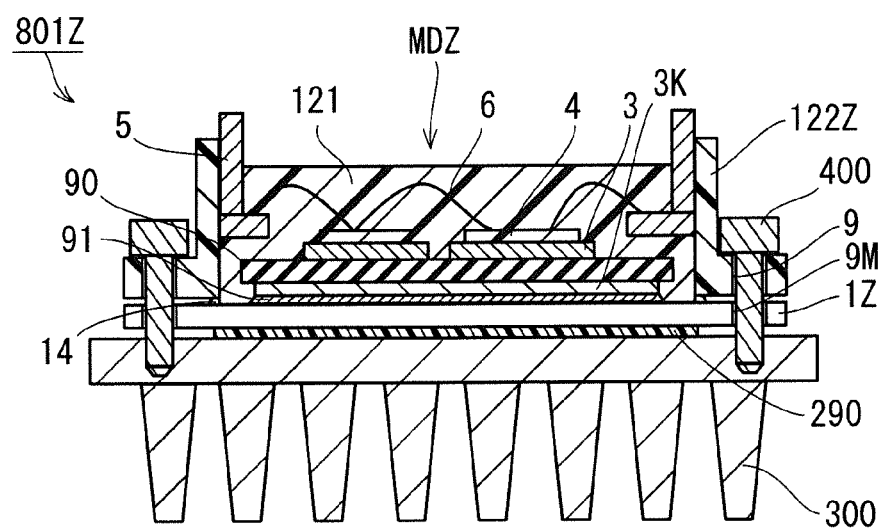
FIG. 6 is a diagram showing the configuration of a cooler-equipped semiconductor device according to a comparative example, and is a sectional view along a line VI-VI in FIG. 7.
Figure 7:
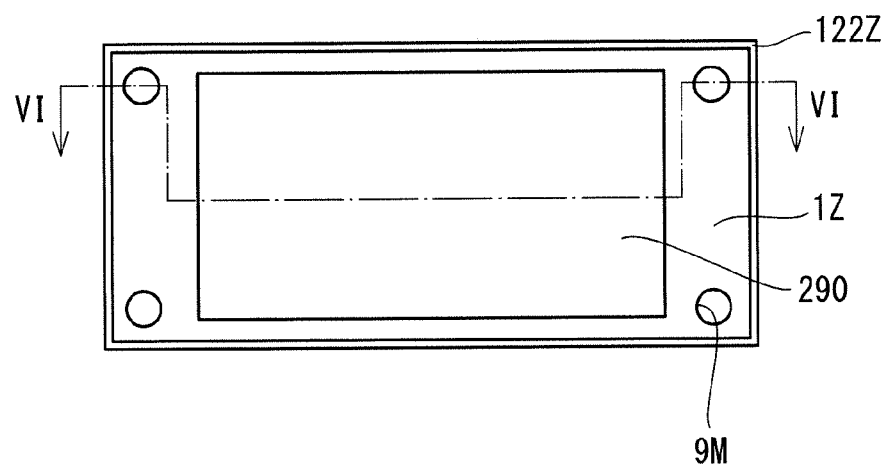
FIG. 7 is a bottom view of FIG. 6.

With reference to FIG. 6 and FIG. 7, a module main body MDZ of the comparative example has the circuit pattern 3, a rear-surface metal layer 3K, the semiconductor element 4, the external electrode 5, the wire 6, an insulating substrate 90, a solder 91, and a sealing material 121. The module main body MDZ is attached to the cooling fin 300 by using a housing 122Z, the screw 400, and a grease 290 to configure a cooling-fin-equipped power module 801Z.

The housing 122Z is arranged on the outer periphery of the module main body MDZ. The housing 122Z and the cooling fin 300 sandwich an outer peripheral portion of a base plate 1Z. The screw 400 is attached to the cooling fin 300 through the attaching holes 9 and 9M respectively formed in the housing 122Z and the base plate 1Z. In this manner, the rear surface of the base plate 1Z is pressed against the cooling fin 300 through the grease 290. Heat generated by the semiconductor element 4 during the operation of the cooling-fin-equipped power module 801Z is transmitted from the bottom surface of the base plate 1Z to the cooling fin 300 through the grease 290. The grease 290 is applied to the base plate 1Z or the cooling fin 300 in advance before the attaching operation is started. As the grease 290, a grease having relatively high fluidity even at an ordinary temperature is used to make the application easy. For example, a grease having a viscosity of 100 to 500 Pa·s is used.

Figure 8:
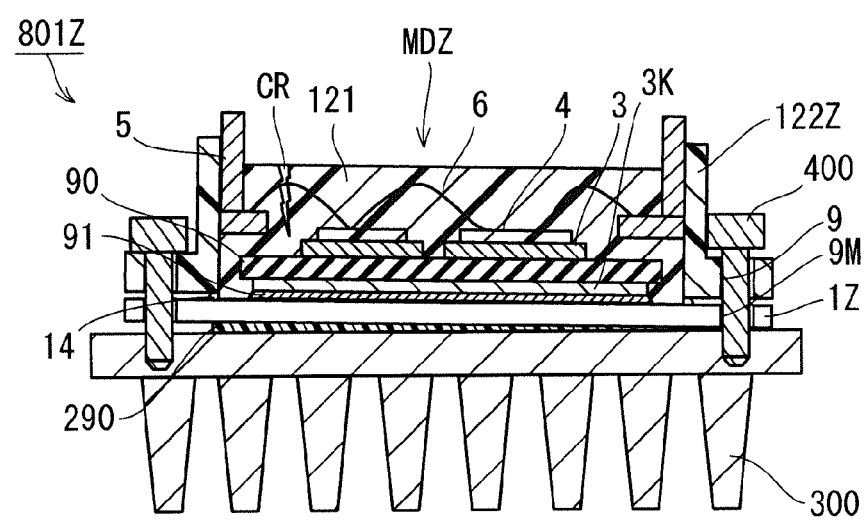
FIG. 8 is a sectional view showing a manner in which a thickness of grease is deviated in FIG. 6.

With reference to FIG. 8, the grease 290 easily has a deviated thickness for various reasons. A first reason to be supposed is warpage occurring in the base plate 1Z in application of the grease 290. This warpage may occur due to a difference between thermal expansion coefficients of the members configuring the module main body MDZ. A second reason to be supposed is a fluctuation in tightening torque of the screw 400. In the comparative example, since a member serving as a spacer between the base plate 1Z and the cooling fin 300 is not present when the screw 400 is fastened, even a relatively small fluctuation in torque may cause deviation of thickness of the grease 290.

When the thickness of the grease 290 is deviated, uneven force acts on the module main body MDZ when the screw 400 is fastened to cause cracks CR to occur in the sealing material 121. The cracks CR may deteriorate the capability of preventing dielectric breakdown in the sealing material 121. When the thickness of the grease 290 is deviated, even though a drawback is not specially present when the screw 400 is fastened, another drawback may occur when the operation of the semiconductor element 4 is repeated. This will be described below.

When unevenness in thickness of the grease 290 is large, unevenness of heat conductivity between the bottom surface of the base plate 1Z and the cooling fin 300 also increases. In this state, when the cooling-fin-equipped power module 801Z is repeatedly operated, the warped shape of the rear surface of the base plate 1Z largely changes to cause a phenomenon (also referred to as pumping out) in which the grease 290 moves from the center of the cooling fin 300 to the outside thereof.

Figure 9A:
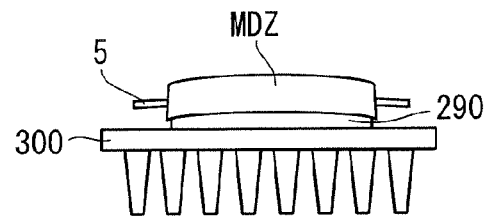
FIG. 9A is a side view typically showing the configuration of the cooler-equipped semiconductor device according to the comparative example.
Figure 9B:
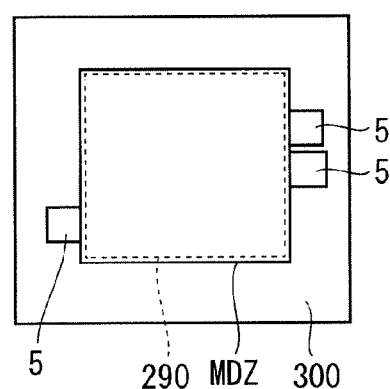
FIG. 9B is an upper view thereof.
Figure 10A:
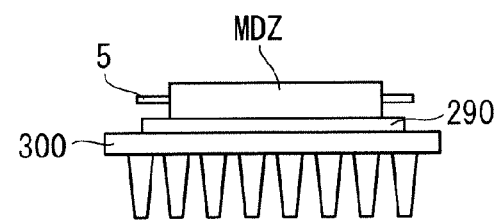
FIG. 10A is a side view showing one condition after the cooler-equipped semiconductor device in FIGS. 9A and 9B is used.
Figure 10B:
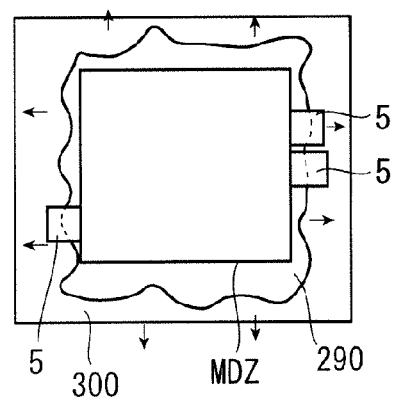
FIG. 10B is an upper view thereof.
Figure 11A:
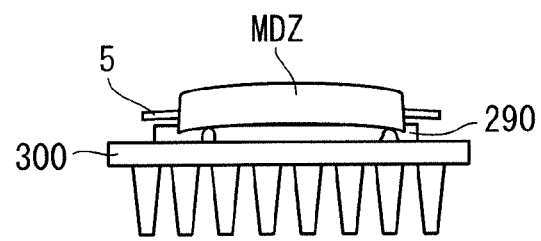
FIG. 11A is a side view showing a condition after the condition of the cooler-equipped semiconductor device in FIGS. 10A and 10B.
Figure 11B:
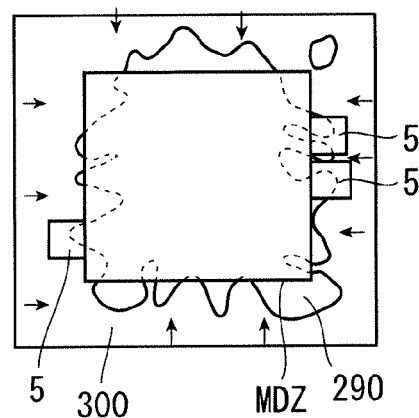
FIG. 11B is an upper view thereof.
Figure 12:
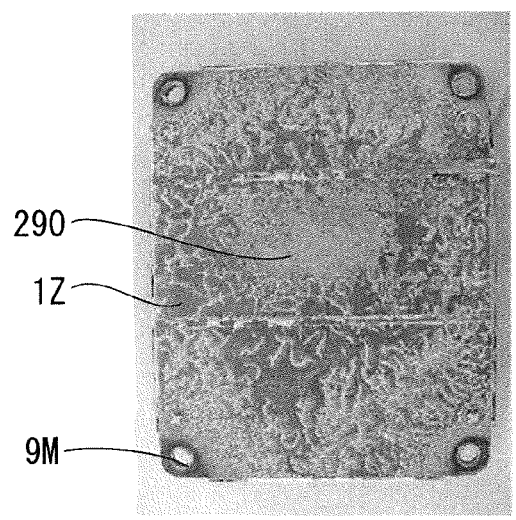
FIG. 12 is a photograph showing an example of a distribution of grease on a bottom surface of the base plate in a module main body in FIG. 11B.

More specifically, due to the occurrence of heat cycle, the grease 290 that has been under the module main body MDZ as shown in FIGS. 9A and 9B is discharged to the outside as shown in FIGS. 10A and 10B, and then sucked into a portion under the module main body MDZ again as shown in FIGS. 11A and 11B. This operation is repeated, as illustrated in FIG. 12, a portion (void) in which the grease 290 is not applied on the bottom surface of the base plate 1Z is formed. Since the presence of void considerably deteriorates heat conductivity, a cooling effect achieved by the cooling fin 300 decreases. Thus, a normal operation of the semiconductor element 4 may be difficult.

According to the present invention, when the base plate 1 is attached to the cooling fin 300 (FIG. 3), a posture of the base plate 1 with reference to the cooling fin 300 is regulated by the solid-phase intermediate layer 200 arranged on the base plate 1. More specifically, a space between the heat-radiation surface SR of the base plate 1 and the cooling fin 300 can be kept while the heat-radiation surface SR of the base plate 1 and the surface of the cooling fin 300 facing the heat-radiation surface SR are made almost parallel to each other. Thus, stress generated when the base plate 1 is attached is suppressed from being deviated. Thus, the thickness distribution of the intermediate layer 200F (FIG. 4) having a phase changed into a liquid-phase state with heat after the base plate 1 is attached is suppressed from being disturbed due to the deviated stress.

When the state of the intermediate layer 200 is changed into a liquid-phase state (FIG. 4), the projecting bottom portion 110P of the cover 110 is supported by the cooling fin 300 to keep a space that is necessary for the liquid-phase intermediate layer 200F to be stably present between the base plate 1 and the cooling fin 300. Thus, preferable thermal and mechanical contacts between the base plate 1 and the cooling fin 300 can be achieved.

The intermediate layer 200 (FIG. 1) is in a hard solid-phase state unlike the grease. For this reason, a semiconductor device on which the intermediate layer 200 is formed can be easily transported.

The intermediate layer 200 preferably has a plurality of patterns separated from each other on the heat-radiation surface SR of the base plate 1 (FIG. 2). In this manner, the distribution of the intermediate layer 200 on the heat-radiation surface SR can be made more uniform while a space is kept in which the intermediate layer 200 spreads when it is changed into a liquid-phase state, in comparison with a case in which the intermediate layer 200 is unevenly present as one pattern. Thus, the thickness distribution of the intermediate layer 200F (FIG. 4) having a phase changed into a liquid-phase state after the base plate 1 is attached is suppressed from being disturbed.

Second Preferred Embodiment

Figure 13:
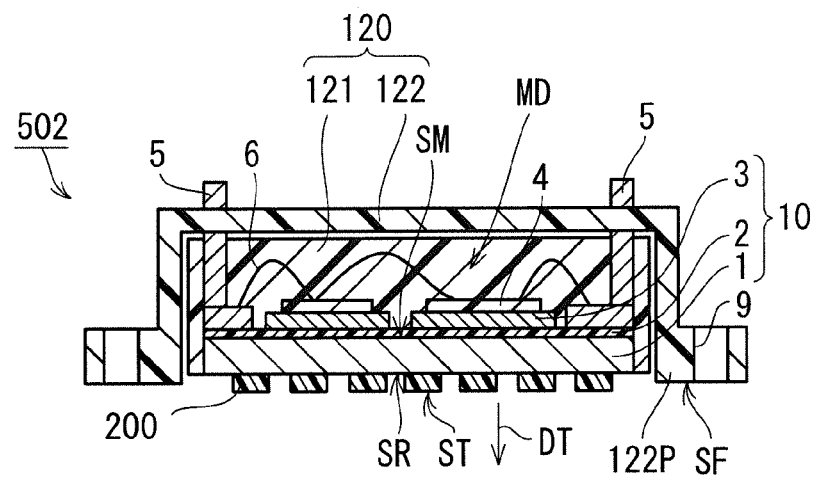
FIG. 13 is a sectional view schematically showing the configuration of a semiconductor device according to a second preferred embodiment of the present invention.

With reference to FIG. 13, a power module 502 (semiconductor device) has a cover 120 in place of the cover 110 (FIG.

1). The cover 120 has the sealing material 121 and a housing 122. The sealing material 121 seals the semiconductor element 4 on the mounting surface SM of the base plate 1. The sealing material 121 is formed in the housing 122. In other words, the power module 502 has the housing 122 and a module main body MD stored in the housing 122. In the housing 122, the attaching hole 9 to attach the cooling fin 300 (see FIG. 3) is formed.

The housing 122 has a projecting bottom portion 122P (projecting portion) arranged outside the heat-radiation surface SR and projecting from the level of the heat-radiation surface SR in the thickness direction DT. With the configuration, the projecting bottom portion 122P has an attaching surface SF projecting from the level of the heat-radiation surface SR in the thickness direction DT. In this manner, a step rising from the heat-radiation surface SR of the base plate 1 to the attaching surface SF of the housing 122 is formed. The projecting bottom portion 122P, like the projecting bottom portion 110P (FIG. 2), preferably completely surrounds the intermediate layer 200 on the base plate 1. The cover 120 is made of, for example, a resin. The intermediate layer 200 projects from the level of the projecting bottom portion 122P in the thickness direction DT.

Since a configuration except for the configuration described above is almost the same as the configuration of the first preferred embodiment described above, the same reference numerals denote the same elements or corresponding elements, and a description thereof will not be repeated.

According to the preferred embodiment, by the housing 122 that is a member different from the sealing material 121, the projecting bottom portion 122P serving as a projecting portion projecting from the level of the heat-radiation surface SR can be configured.

Figure 14:
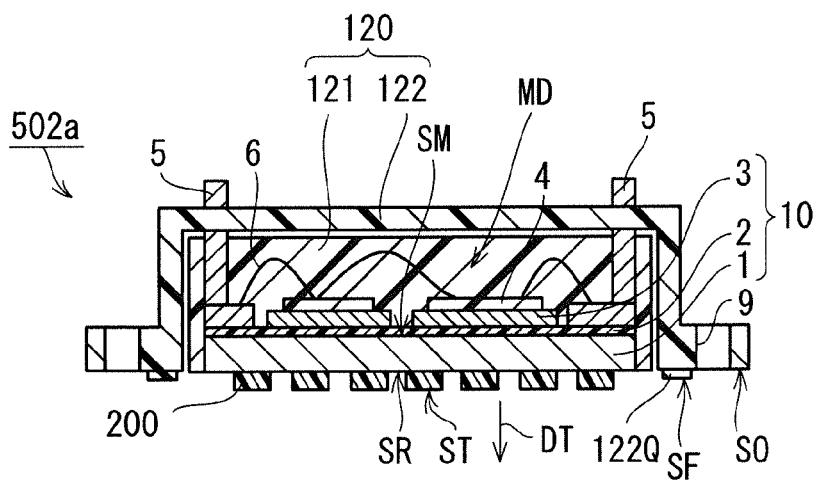
FIG. 14 is a schematic sectional view showing a first modified example of FIG. 13.

With reference to FIG. 14, in a power module 502a (semiconductor device) according to a first modified example, the housing 122 has a facing surface SO facing the cooling fin 300 (see FIG. 3) of the base plate 1. The housing 122 has a projection 122Q (projecting portion) projecting from the facing surface SO. The intermediate layer 200 projects from the level of the projection 122Q in the thickness direction DT.

According to the modified example, the size of a portion of the projection 122Q projecting from the facing surface SO is adjusted to make it possible to adjust the thickness of a space that is necessary for the liquid-phase intermediate layer 200F (see FIG. 4) to be present. Thus, the thickness of the intermediate layer 200F can be adjusted. The adjustment can be performed depending on the magnitude of warpage of the rear surface of the base plate 1. This warpage may occur because the module main body MD has a configuration in which a plurality of members having different thermal expansion coefficients are connected to each other.

Figure 15:
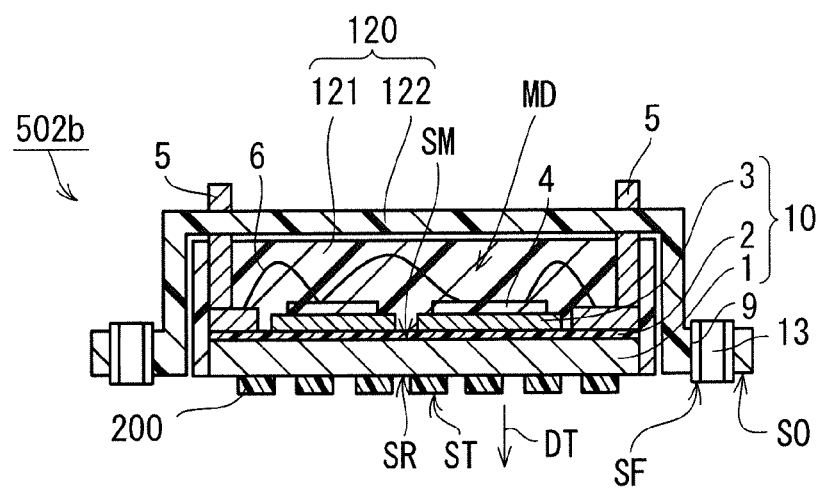
FIG. 15 is a schematic sectional view showing a second modified example of FIG. 13.

With reference to FIG. 15, in a power module 502b (semiconductor device) of a second modified example, a metal bushing 13 (projecting portion) inserted into the attaching hole 9 is provided on the housing 122. The metal bushing 13 is to prevent the housing 122 from creeping. The metal bushing 13 projects from the facing surface SO described above. The intermediate layer 200 projects from the level of the projection 13 in the thickness direction DT.

According to the modified example, the metal bushing 13 can configure a portion projecting from the heat-radiation surface SR of the base plate 1, i.e., a projecting portion. Thus, the metal bushing 13 can have both the function of preventing creeping and the function of configuring the projecting portion.

Figure 16:
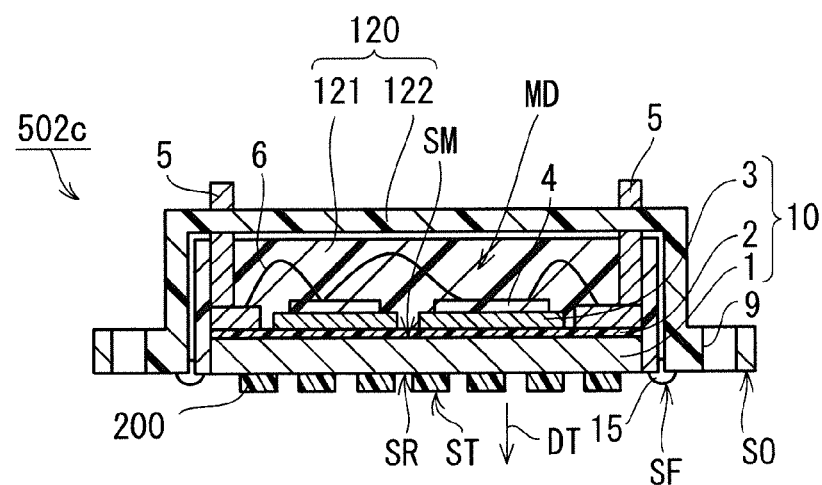
FIG. 16 is a schematic sectional view showing a third modified example of FIG. 13.

With reference to FIG. 16, in a power module 502c (semiconductor device) of a third modified example, the cover 120 has an adhesive portion 15 that bonds the sealing material 121 and the housing 122 to each other. The adhesive portion 15 protrudes in the thickness direction DT from between the module main body MD and the housing 122. The intermediate layer 200 projects from the level of the projection 15 in the thickness direction DT.

According to the modified example, the adhesive portion 15 that bonds the sealing material 121 and the housing 122 to each other can configure a portion projecting from the heat-radiation surface SR, i.e., a projecting portion. More specifically, the step of bonding the module main body MD and the housing 122 to each other and the step of configuring the projecting portion can be simultaneously performed. An amount of adhesive agent applied when the adhesive portion 15 is formed is adjusted to make it possible to adjust the size of the projecting portion.

Third Preferred Embodiment

Figure 17:
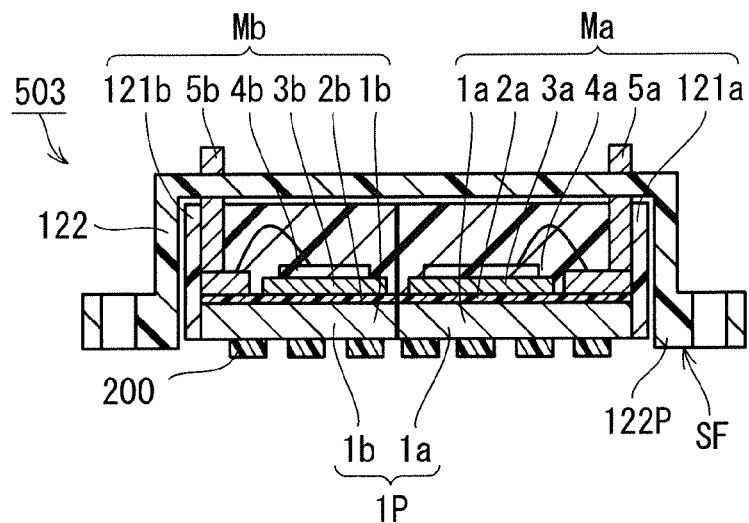
FIG. 17 is a sectional view schematically showing the configuration of a semiconductor device according to a third preferred embodiment of the present invention.

With reference to FIG. 17, a power module 503 (semiconductor device) has a base plate 1P. The base plate 1P has a portions 1a and 1b coupled to each other by the housing 122. Module main bodies Ma and Mb are configured by using the portions 1a and 1b, respectively. In other words, the power module 503 has the module main bodies Ma and Mb coupled to each other by being stored in the housing 122. The module main body Ma has the portion 1a of the base plate, an insulating layer 2a, a circuit pattern 3a, a semiconductor element 4a, an external electrode 5a, and a sealing material 121a. The module main body Mb has the portion 1b of the base plate, the insulating layer 2b, the circuit pattern 3b, the semiconductor element 4b, the external electrode 5b, and a sealing material 121b.

According to the preferred embodiment, the plurality of module main bodies Ma and Mb can be integrally handled such that the module main bodies Ma and Mb are coupled to each other by the housing 122.

Fourth Preferred Embodiment

Figure 18:
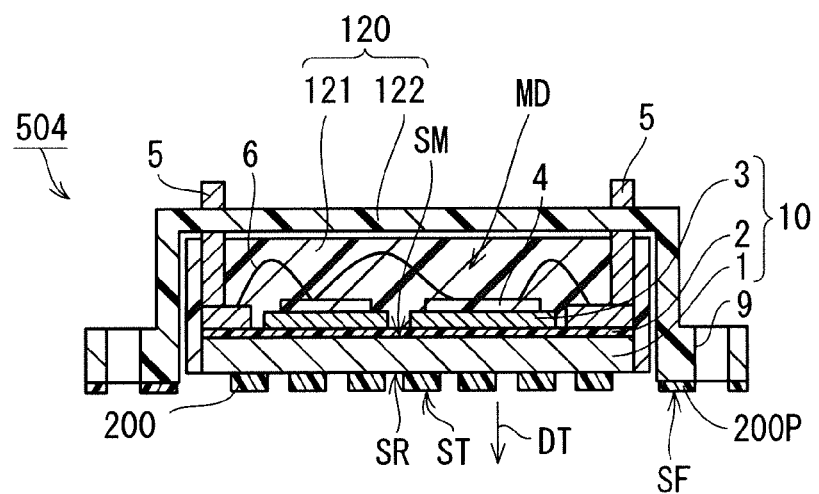
FIG. 18 is a sectional view schematically showing the configuration of a semiconductor device according to a fourth preferred embodiment of the present invention.

With reference to FIG. 18, in a power module 504 (semiconductor device) according to the preferred embodiment, a non-phase-change portion 200P (projecting portion) made of a thermoplastic resin is formed on the bottom of the housing 122. The thermoplastic resin is similar to or the same as the material of the intermediate layer 200. The non-phase-change portion 200P is arranged outside the heat-radiation surface SR and projects from the level of the heat-radiation surface SR in the thickness direction DT. With the configuration, the non-phase-change portion 200P has the attaching surface SF projecting from the level of the heat-radiation surface SR in the thickness direction DT. The intermediate layer 200 projects from the level of the non-phase-change portion 200P in the thickness direction DT.

The thickness of the non-phase-change portion 200P is preferably smaller than the thickness of the intermediate layer 200. In this case, the bottom of the housing 122 projects from the level of the heat-radiation surface SR in the thickness direction DT. In other words, in this case, the power module 504 has a configuration in which the non-phase-change portion 200P is added on the attaching surface SF of the power module 502 (FIG. 13).

In this case, the manufacturing steps are simplified.

Since a configuration except for the configuration described above is almost the same as the configuration of the second preferred embodiment described above, the same reference numerals denote the same elements or corresponding elements, and a description thereof will not be repeated.

According to the preferred embodiment, the non-phase-change portion 200P can adjust a degree of projection of the attaching surface SF in the thickness direction DT. The non-phase-change portion 200P is made of the same material as that of the intermediate layer 200 or a material similar to the material of the intermediate layer 200 to make it possible to simplify the processes.

Since the non-phase-change portion 200P, unlike the intermediate layer 200, is formed not on the base plate 1 but on the housing 122, the non-phase-change portion 200P does not easily receive an increase in temperature caused by the operation of the semiconductor element 4. In this manner, the non-phase-change portion 200P can be kept in a solid-phase state even though the phase of the intermediate layer 200 is changed into a liquid-phase state by an increase in temperature. Thus, the non-phase-change portion 200P is continuously stably supported with the cooling fin 300.

Fifth Preferred Embodiment

Figure 19:
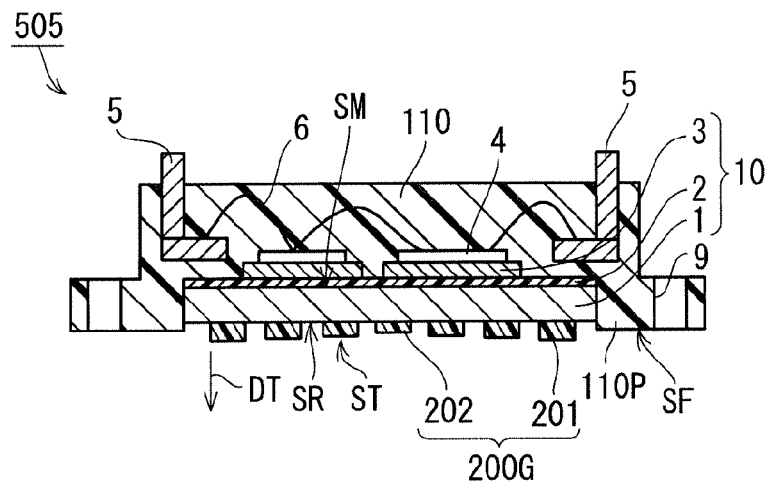
FIG. 19 is a sectional view schematically showing the configuration of a semiconductor device according to a fifth preferred embodiment of the present invention.

With reference to FIG. 19, a power module 505 (semiconductor device) has an intermediate layer 200G in place of the intermediate layer 200 (FIG. 1). The intermediate layer 200G has different thicknesses on the heat-radiation surface SR of the base plate 1. More specifically, the intermediate layer 200G includes a thick-film portion 201 and a thin-film portion 202 thinner than the thick-film portion 201. The thin-film portion 202 is formed on the center of the heat-radiation surface SR. The thick-film portion 201 is arranged outside the thin-film portion 202 on the heat-radiation surface SR. More specifically, the intermediate layer 200G has a thickness that gradually increases from the center to the edge on the heat-radiation surface SR.

Figure 20:
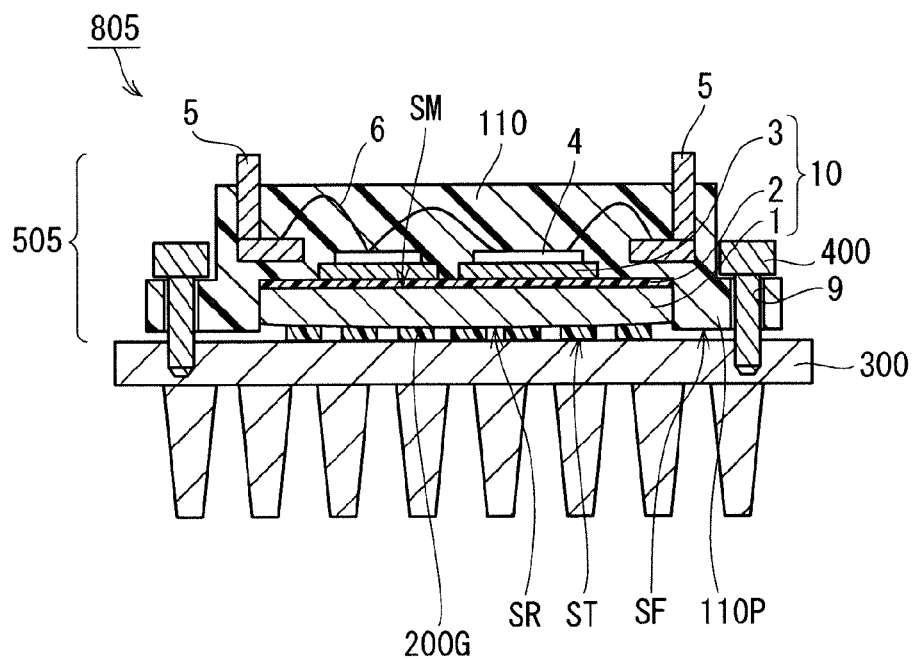
FIG. 20 is a sectional view schematically showing one step in a method of attaching the semiconductor device in FIG. 19 to a cooler.

With reference to FIG. 20, in a cooling-fin-equipped power module 805 having power module 505, when the base plate 1 is warped such that the heat-radiation surface SR has a protruding shape, the intermediate layer 200G having a thickness distribution corresponding to the warpage is arranged. In this manner, the power module 505 can be more stably attached to the cooling fin 300.

Since a configuration except for the configuration described above is almost the same as the configuration of the first or second preferred embodiment described above, the same reference numerals denote the same elements or corresponding elements, and a description thereof will not be repeated.

According to the preferred embodiment, the thickness distribution of the intermediate layer 200G is not made uniform but can be caused to correspond to the warpage of the base plate 1. In this manner, when the base plate 1 has warpage, more preferable thermal and mechanical contacts between the base plate 1 and the cooling fin 300 can be achieved.

Sixth Preferred Embodiment

In the preferred embodiment, a method of manufacturing the power module (semiconductor device) described above will be described below.

With reference to FIG. 1, the base plate 1 is prepared first, and the semiconductor element 4 is mounted on the mounting surface SM. A cover 110 having a portion that seals the semiconductor element 4 on the mounting surface SM is formed. The intermediate layer 200 is formed as described below.

Figure 21:
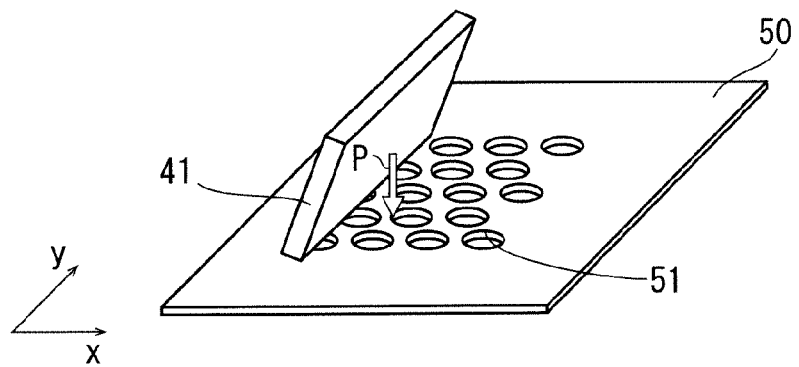
FIG. 21 is a perspective view schematically showing one step in a method of manufacturing a semiconductor device according to a sixth preferred embodiment of the present invention.

With reference to FIG. 21, an orthogonal coordinate system xy is added to make the drawing easy to understand. A print mask 50 (mask plate) having an xy plane is prepared. On the xy plane, a hole having a pattern corresponding to the pattern of the intermediate layer 200 to be formed is formed. The print mask 50 is arranged on the heat-radiation surface SR (for example, see FIG. 1 and FIG. 2) of the base plate 1. A liquid-phase thermoplastic material is placed on the print mask 50. On the print mask 50, a printing squeegee 41 is moved in an x direction to pass over a print pattern 51 while the width direction of the printing squeegee 41 is kept in a y direction. In this manner, a liquid-phase thermoplastic material is applied onto the heat-radiation surface SR. The liquid-phase thermoplastic material is hardened to form the intermediate layer 200. In the above printing operation, a pressure acting when the printing squeegee 41 is pressed against the print mask 50, i.e., a print pressure P is changed to make it possible to change a print thickness.

According to the preferred embodiment, the intermediate layer 200 can be formed by application performed by the printing squeegee 41. In a printing operation for applying a thermoplastic material, the print pressure P may be adjusted. To adjust the pressure, for example, a force for pressing the printing squeegee 41 against the print mask 50 (FIG. 22) is adjusted, or a printing squeegee 42 (FIG. 23) having a special shape is used. This will be described below.

Figure 22:
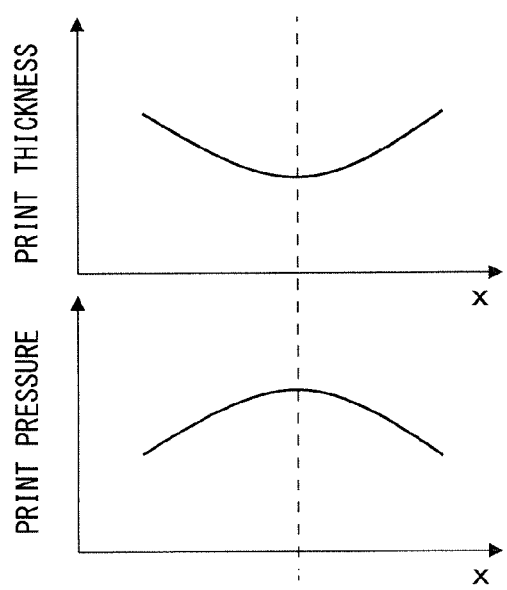
FIG. 22 is a graph illustrating a printing pressure and a print thickness in the step in FIG. 21 in a printing direction.

With reference to FIG. 22, the force for pressing the printing squeegee 41 against the print mask 50 is adjusted to adjust a print pressure, so that a print thickness distribution of the intermediate layer 200 can be adjusted in a direction x as a print direction. More specifically, when the print pressure is temporarily increased and then decreased, the intermediate layer 200 having thicknesses at the both ends larger than that at the center in the direction x as the print direction can be formed.

Figure 23A:
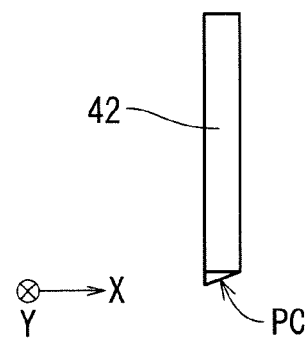
FIG. 23A is a sectional view showing an example of a squeegee used in the step in FIG. 21.
Figure 23B:
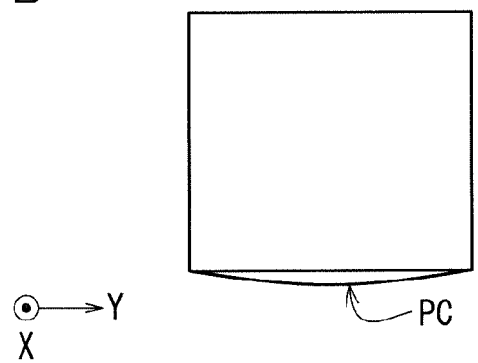
FIG. 23B is a front view of the squeegee.

With reference to FIG. 23, the orthogonal coordinate system xy is added to make the drawing easy to understand. Unlike in the normal printing squeegee 41 described above, in the printing squeegee 42, a contact portion PC brought into contact with the print mask 50 has at least one of a protruding portion and a recessed portion (the contact portion PC having the protruding portion is shown in the drawing). In other words, the printing squeegee 42 has a length direction X almost corresponding to the print direction and a width direction Y orthogonal to the length direction X, and, on the surface of the contact portion PC, an uneven shape changing depending on the width direction Y is formed. More specifically, the contact portion PC has a protruding portion having a projection amount that is large at the center in the Y direction.

Figure 24:
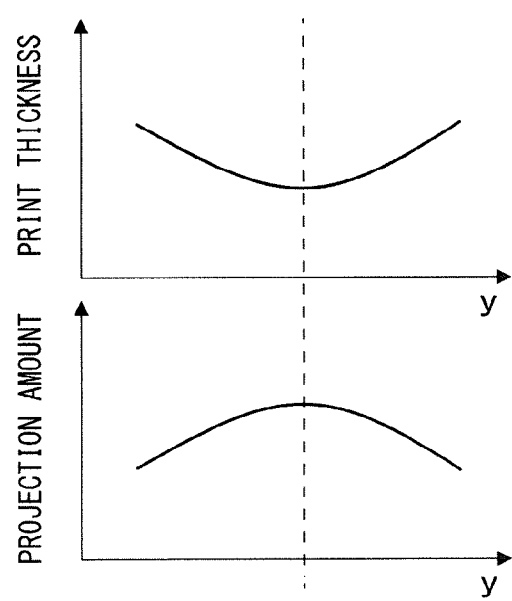
FIG. 24 is a graph illustrating a projection amount of the squeegee and the print thickness in a direction orthogonal to a printing direction in FIG. 21.

With reference to FIG. 24, the thickness distribution of the intermediate layer 200 can be adjusted in the direction y (FIG. 21) orthogonal to the print direction.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device having a heat-radiation surface for radiating heat to a cooler, comprising:

preparing a base plate having a mounting surface, said heat-radiation surface opposed to said mounting surface, and a thickness direction extending from said mounting surface to said heat-radiation surface;

mounting a semiconductor element on said mounting surface; and forming a cover having a portion that seals said semiconductor element on said mounting surface of said base plate, said cover having a projecting portion arranged outside said heat-radiation surface and projecting from a level of said heat-radiation surface in said thickness direction, and forming an intermediate layer arranged on said heat-radiation surface of said base plate, projecting from a level of said projecting portion in said thickness direction, and made of a thermoplastic material in a solid-phase state, wherein the forming of said intermediate layer includes applying a thermoplastic material in a liquid-phase state on said heat-radiation surface by moving a squeegee on a mask plate arranged on said heat-radiation surface of said base plate.

2. The method of manufacturing a semiconductor device according to claim 1, wherein the applying of said thermoplastic material includes adjusting a pressure for pressing said squeegee against said mask plate.

3. The method of manufacturing a semiconductor device according to claim 1, wherein said squeegee has a contact portion brought into contact with said mask plate, and said contact portion has at least one of a protruding portion and a recessed portion.

4. A semiconductor device having a heat-radiation surface for radiating heat to a cooler, comprising:

a semiconductor element;

a base plate having a mounting surface on which said semiconductor element is mounted, said heat-radiation surface opposed to said mounting surface, and a thickness direction extending from said mounting surface to said heat-radiation surface;

a cover having a portion that seals said semiconductor element on said mounting surface of said base plate, said cover having a projecting portion arranged outside said heat-radiation surface and projecting from a level of said heat-radiation surface in said thickness direction; and an intermediate layer arranged on said heat-radiation surface of said base plate, projecting from a level of said projecting portion of said cover in said thickness direction, and made of a thermoplastic material in a solid-phase state.

5. The semiconductor device according to claim 4, wherein said intermediate layer has a plurality of patterns separated from each other on said heat-radiation surface of said base plate.

6. The semiconductor device according to claim 4, wherein said intermediate layer has different thicknesses on said heat-radiation surface of said base plate.

7. The semiconductor device according to claim 4, wherein said cover has a housing having said projecting portion and a sealing material arranged in said housing.

8. The semiconductor device according to claim 7, wherein said base plate has a plurality of portions coupled to each other by said housing.

9. The semiconductor device according to claim 7, wherein said housing has a facing surface facing said cooler, and said projecting portion projects from said facing surface.

10. The semiconductor device according to claim 7, wherein a through hole for attaching said cooler is formed in said housing, and said projecting portion is configured by a metal bushing inserted into said through hole.

11. The semiconductor device according to claim 7, wherein said projecting portion is made of a thermoplastic material.

12. The semiconductor device according to claim 7, wherein said projecting portion is configured by an adhesive portion that bonds said housing and said sealing material to each other.

* * * * *